US008329046B2

(12) United States Patent
Dove et al.

(10) Patent No.: US 8,329,046 B2
(45) Date of Patent: Dec. 11, 2012

(54) METHODS FOR DAMAGE ETCH AND TEXTURING OF SILICON SINGLE CRYSTAL SUBSTRATES

(75) Inventors: Curtis Dove, Pueblo, CO (US); Cindy Dutton, Fallbrook, CA (US); Greg Bauer, Livermore, CA (US); Christopher Myers, San Diego, CA (US); Mehdi Balooch, Berkeley, CA (US)

(73) Assignee: Asia Union Electronic Chemical Corporation, Kaohsiung County (TW)

( * ) Notice: Subject to any disclaimer, the term of this patent is extended or adjusted under 35 U.S.C. 154(b) by 465 days.

(21) Appl. No.: 12/366,141

(22) Filed: Feb. 5, 2009

(65) Prior Publication Data

US 2010/0197144 A1    Aug. 5, 2010

(51) Int. Cl.
*H01B 13/00* (2006.01)
(52) U.S. Cl. .............. 216/20; 216/83; 216/99; 136/256; 136/259; 438/68; 438/690; 438/753
(58) Field of Classification Search ........................ 451/5
See application file for complete search history.

(56) References Cited

U.S. PATENT DOCUMENTS

| 3,998,659 | A |   | 12/1976 | Wakefield |               |
|-----------|---|---|---------|-----------|---------------|
| 4,514,582 | A | * | 4/1985  | Tiedje et al. | ............... 136/256 |
| 4,608,451 | A | * | 8/1986  | Landis | ........................ 136/256 |
| 4,683,160 | A | * | 7/1987  | Bloch et al. | .................. 428/141 |
| 5,101,260 | A | * | 3/1992  | Nath et al. | ...................... 257/53 |
| 5,589,704 | A | * | 12/1996 | Levine | ........................... 257/436 |
| 6,093,882 | A | * | 7/2000  | Arimoto | ........................ 136/252 |
| 6,245,245 | B1 | * | 6/2001 | Sato | ................................ 216/27 |
| 6,420,647 | B1 | * | 7/2002 | Ji et al. | ........................... 136/259 |
| 6,451,218 | B1 | * | 9/2002 | Holdermann | .................... 216/99 |
| 2001/0039101 | A1 | * | 11/2001 | Wenski | ......................... 438/471 |
| 2003/0207513 | A1 | * | 11/2003 | Saitou et al. | .................. 438/200 |
| 2005/0082651 | A1 | * | 4/2005 | Farnworth et al. | ............ 257/678 |
| 2007/0072423 | A1 | * | 3/2007 | Hensel et al. | ................. 438/689 |
| 2007/0278183 | A1 | * | 12/2007 | Lee et al. | ........................ 216/83 |
| 2008/0004197 | A1 |   | 1/2008 | Kneer |               |
| 2008/0160661 | A1 |   | 7/2008 | Henley |               |

OTHER PUBLICATIONS

Irena Zubel, Malgorzata Kramkowska, The effect of isopropyl alcohol on etching rate and roughness of (100) Si surface etched in KOH and TMAH solution, 2001, Sensors and Actuators A 93 p. 138-147.*
G-S. Chung, Anisotropic Etching Characteristics of Si in Tetramethylammonium Hydrozide: Isoproply Alcohol: Pyrazine Solutions, Journal of the Korean Physical Society, May 2005, pp. 1152-1156, vol. 46, No. 5, Korea.
U. Gangopadhyay, K.H. Kim, S.K. Dhun Gel, U. Manna, P.K. Basu, M. Banerjee, H. Saha, J. Yi, A Novel Low Cost Texturization Method for Large Area Commercial Mono-Crystalline Silicon Solar Cells, Solar Energy Materials & Solar Cells 90, 2006, pp. 3557-3567.

(Continued)

*Primary Examiner* — Duy Deo
*Assistant Examiner* — Erin Bergner
(74) *Attorney, Agent, or Firm* — David A. Hey

(57) ABSTRACT

Methods for performing damage etch and texturing of single crystal silicon substrates, particularly for use as solar cells or photovoltaic cells. Damage etch with a TMAH solution followed by texturing using solution of KOH or NaOH mixed with IPA is particularly advantageous. The substitution of some of the IPA with ethylene glycol further improves results. Also disclosed is a process that combines both damage etch and texturing etch into a single step.

9 Claims, 3 Drawing Sheets

OTHER PUBLICATIONS

D.L. King. M. E. Buck, Experimental Optimization of an Anisotropic Etching Process for Random Texturization of Silicon Solar Cells, Proceedings of 22nd IEEE International Photovoltaic Specialists Conference, 1991, pp. 303-308, Las Vegas, Nevada.

Z. Xi, D. Yang, W. Dan, C. Jun, X. Li, D. Que, Investigiation of Texturization for Monocrystalline Silicon Solar Cells with Different Kinds of Alkaline, Renewal Energy 29, 2004, pp. 2101-2107. W/International Search Report, Apr. 23, 2010.

* cited by examiner

METHODS FOR DAMAGE ETCH AND TEXTURING OF SILICON SINGLE CRYSTAL SUBSTRATES

FIELD OF THE INVENTION

The present invention relates to methods of performing damage etch and texturing of single crystal silicon substrates, particularly for use as solar cells or photovoltaic cells.

BACKGROUND OF THE INVENTION

Photovoltaic solar cells are thin silicon disks that can be used to convert sunlight into electricity and serve as an energy source for a wide variety of uses. For example, small area solar cells can be used to power calculators, cell phones and other small electronic devices. Larger panels can be used for supplementing or fulfilling the electrical needs of individual residences, lights, pumping, cooling, heating, etc.

Research into the use of solar energy as a power source began as early as 1839 with the discovery that materials that were sensitive to light could be used to convert sunlight into electricity. An early solar cell, made of gold-coated selenium was produced in 1877, although it was only one percent efficient, i.e. converted only one percent of the incoming sunlight into electricity. Einstein's explanation of the photoelectric effect in 1905 spurred new interest in producing solar electricity at higher efficiencies. However, little progress was made until advances in diodes and transistors allowed silicon solar cells exhibiting four percent efficiency to be produced in 1954. Further work produced solar cells having efficiency up to 15 percent that were used in rural and isolated areas as power sources for a telephone relay system.

In order to meet domestic energy needs, efficiency of solar cells had to be further improved, while maintaining cost effectiveness. Conventional silicon based high efficiency solar cells are produced from single crystalline silicon. In order to make single crystalline silicon wafers, pure silicon starting material must first be obtained. Pure silicon is produced from silicon dioxide of either quartzite gravel or crushed quartz that has been processed in an electric arc furnace to release oxygen and produce carbon dioxide and molten silicon. While this process yields silicon with only one percent impurities, the solar cell industry requires higher purity. One way to produce high purity silicon is to further process the 99 percent pure silicon using a floating zone technique wherein a rod of silicon is passed through a heated zone several times in the same direction. This procedure acts to drag the impurities toward one end of the silicon rod. Once the silicon reaches the desired purity level, the end containing the impurities is removed.

Another method for producing high purity single crystalline wafers is known as the Czochralski method. In this process, a boule of silicon is created, by repeatedly dipping a seed crystal of silicon into melted silicon. As the seed crystal is withdrawn and rotated, a cylindrical ingot, the boule, of single crystalline silicon is formed. This boule is highly pure because impurities tend to remain in the liquid silicon.

Silicon wafers are sliced from the boule one at a time using a single blade circular saw or many at time using a multiwire saw. Slicing results in loss of up to half of the original boule and further cutting may be carried out to shape the wafers into rectangles or hexagons, for fitting together into a solar cell array. The slicing and cutting of the wafers creates roughness and defects caused by saw-damage. These areas of roughness and damage must be removed in order to form an abrupt, defect free p-n junction and contact wires needed for the final solar cell. Roughness and damage is typically removed by an aggressive anisotropic etch process known as "damage etch".

Several different etch solutions have been proposed and used to perform the damage etch. The most common technique for single crystals uses an etching solution of KOH or NaOH solutions in deionized (DI) water at about 80° C. However, the use of these etching solutions exhibit significant disadvantages. In particular, KOH or NaOH solutions do not wet the silicon surface well, and frequently experience non-uniform hydrogen bubble buildup that prevents uniform contact between the silicon surface and the etching solution. This can result in non-uniform etching across the wafer, which leads to variation in solar cell efficiency and lower reproducibility of the solar cell product. In addition, the KOH or NaOH solutions do not efficiently or effectively remove contaminants that are caused by the saw slicing and do not passivate the surface of the silicon, again resulting in a reduction in the efficiency of the solar cells produced.

Other solutions have been used to etch silicon, but have not been suggested for use in solar cell damage etch processes. Rather, tetramethylammonium hydroxide (TMAH), isopropyl alcohol (IPA) and pyrazine have been used to etch silicon for use in MEMS applications. These solutions provide an etch that obtains a flat surface with minimal undercutting of mask layers. (see Chung, *Anisotropic Etching Characteristics of Si in Tetramethylammonium Hydroxide: Isopropyl Alchohol: Pyrazine Solutions*, Journal of the Korean Physical Society, Vol. 46, No. 5, May 2005, pp. 1152-1156).

The result of the damage etch process is a silicon wafer that is very shiny and reflective. The efficiency of a solar cell is determined by the ability to gather or absorb light. While silicon has a large absorption coefficient in the visible light spectrum, it also exhibits a high reflection coefficient. To increase efficiency of solar cells, the reflectivity of the damage etched silicon wafer must be reduced. One common method of reducing reflectance is to coat the silicon wafer with an anti-reflective coating (ARC), such as silicon oxide, silicon nitride or titanium dioxide. However, these films exhibit resonance structures that limit their effectiveness to a small range of angles and wavelengths, such that efficiency depends on the angle of incidence of the light.

Another method of reducing reflectance and improving solar cell efficiency is to texture the silicon wafer surface using a wet-chemical etch to from pyramidal structures. These structures provide higher levels of light trapping based on geometrical optics, e.g. the texturing is on a scale equal to or greater than optical wavelengths of the incident light causing the incident light to reflect multiple times and thereby enhance absorption.

The texturing process is generally carried out using a mixture of KOH or NaOH and PA in DI water as the etchant. (See U.S. Pat. No. 3,998,659; Gangopadhyah et al, *A novel low cost texturization method for large area commercial monocrystalline silicon solar cells*, Solar Energy Materials & Solar Cells, 90, 2006, pp. 3557-3567; King et al., Proceedings of 22$^{nd}$ IEEE International Photovoltaic Specialists Conference, Las Vegas, 1991, pp. 303-308). The addition of IPA serves to mask specific silicon sites, preventing etching by the solution, to thereby form the pyramidal structures. It has also been reported that a combination of IPA and aqueous alkaline ethylene glycol resulted in more uniform pyramidal texturing on highly polished silicon (100) for use in semiconductor electronic applications. (See U.S. Pat. No. 6,451,218). In addition, the use of sodium acetate, anhydrous ($CH_3COONa$) operates in a similar manner to IPA for alkaline texturing, however the two compounds can not co-exist. (see Zhenqiang Xi et al, *Investigation of texturization for monocrystalline* silicon solar cells with different kinds of alkaline, Renewable Energy 29, 2004, pp. 2101-2107). In none of the references noted above has the use of the solutions mentioned been applied to as-cut silicon wafers for purposes texturing a sample that still has saw damage and contamination.

As noted above, the diluted KOH or NaOH damage etch solutions have poor silicon wetability characteristics and do not remove surface contamination effectively, leading to reduced solar cell efficiency and reproducibility.

There remains a need in the art for improvements to the efficiency of solar cells and to methods of performing damage etch and texturing of single crystal silicon substrates.

SUMMARY OF THE PRESENT INVENTION

The present invention provides improved methods for performing damage etch and texturing of single crystal silicon substrates, particularly for use as solar cells or photovoltaic cells. In particular, the present invention performs damage etching with a TMAH solution followed by texturing using a KOH and IPA solution. A further embodiment comprises substitution of a portion of the IPA with ethylene glycol (EG). In addition, the present invention provides for a process that combines both damage etch and texturing etch into a single step.

DETAILED DESCRIPTION OF THE INVENTION

Figure 1:
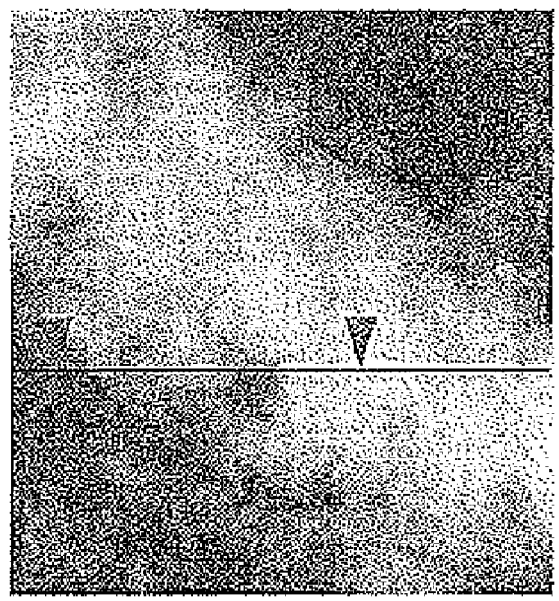
FIG. 1 is an atomic force microscopy (AFM) view of the surface of an as-cut single crystalline silicon wafer.

The present invention sets forth improved methods for carrying out damage etch and texturing of single crystal silicon substrates. These silicon substrates are particularly useful as solar cells or photovoltaic cells.

In one embodiment of the present invention a TMAH solution is used to perform damage etch of an as-cut single crystalline wafer. Texturing of the wafer surface is then done with a solution comprising KOH or NaOH mixed with IPA. TMAH provides good wetting of the silicon wafer surface, unlike the KOH or NaOH solutions used in the prior art. Therefore, using TMAH as the damage etch solution produces a stronger, more resilient wafer that is better prepared to withstand the texturing etch process. After the damage etch is competed, texturing is carried out with a KOH or NaOH mixed with IPA solution that provides uniform pyramidal structures having very low reflectance values.

In a further embodiment of the present invention, by replacing a portion, preferably at least half, of the IPA in the texturing solution with ethylene glycol, even better wetting of the silicon surface is achieved. By including ethylene glycol in the mixture, even lower reflectance values can be achieved and the solution is less expensive and less volatile. This is at least in part because IPA has a very low boiling point and is lost through evaporation during the process. The combination of a TMAH solution for damage etch followed by a KOH or NaOH, IPA and ethylene glycol solution for texturing, also has the advantages that less hazardous waste is produced, greater duration of use for the solutions in situ is possible and surface topography, morphology and uniformity is optimized. Moreover, solar cells produced using the etch solutions according to the present invention, exhibit lower reflectance of light from the UV to the IR range.

The embodiments above each describe a two step process, i.e. separate damage etch and texturing processes. According to a further embodiment of the present invention, a process that combines both damage etch and texturing into a single step is possible. By using a mixture of a fluorinated compound and an alkaline solution it is possible to remove as-cut damage and imbedded impurities, smooth the wafer surface on a macro-scale and perform texturing on a micro-scale in a single step process. In particular, a mixture of ammonium fluoride ($NH_4F$) or ammonium bifluoride ($NH_4HF_2$) and TMAH may be used in a single step process at temperatures up to 100° C. according to the present invention. Additives may be included in the mixture to improve wetting capability and etch rate. The addition of such additives, assists in the formation of pyramidal structures, effectively removes contaminants and passivates the wafer surface thus helping to improve efficiency of solar cell product. Passivation occurs by hydrogen atoms filling the existing silicon dangling that exist on the surface of the silicon wafer. Additives such as IPA and ethylene glycol can be included to improve the wetting capability. In one embodiment of the present invention, a mixture of ammonium fluoride ($NH_4F$) or ammonium bifluoride ($NH_4HF_2$), KOH or NaOH, and TMAH may be used in the single step process according to the present invention.

A further refinement of the present invention can be carried out by modifying the solutions during processing. In particular, as wafers are etched, the etching solution chemical characteristics can change because of the dissolution of silicon into the bath. In order to maintain etch rates at an optimum rate, the etch solution can be modified to compensate for this chemical change. This modification can be carried out in any of the embodiments of the present invention, i.e. two step process or single step process.

By performing the damage etch and texturing according to the present invention, several advantages are achieved. In particular, the chemicals used are more environmentally friendly and a lower quantity is required. In addition, these chemicals are less dangerous to work with than those used in the prior art processes. Moreover, the methods of the present invention result in high efficiency solar cells that can be reproduced with greater uniformity.

Figure 2:
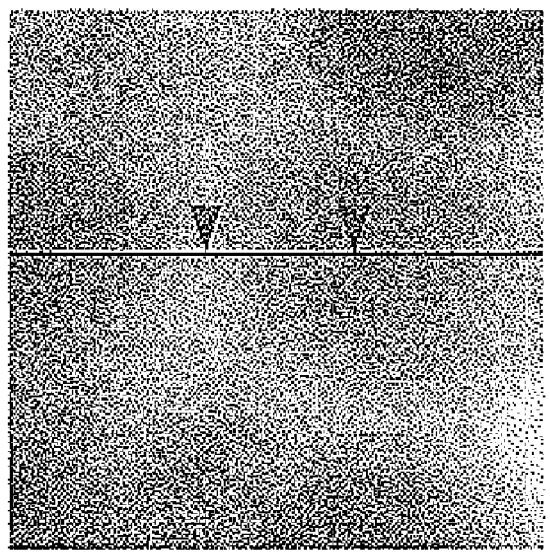
FIG. 2 is an AFM view of the surface of a single crystalline silicon wafer following damage etch using a TMAH etch solution according to one embodiment of the present invention.
Figure 3:
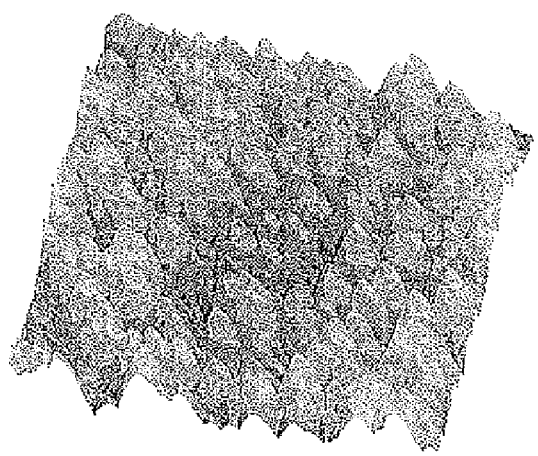
FIG. 3 is an AFM view of a single crystalline silicon wafer following texturing of the surface in accordance with a further embodiment of the present invention.
Figure 4:
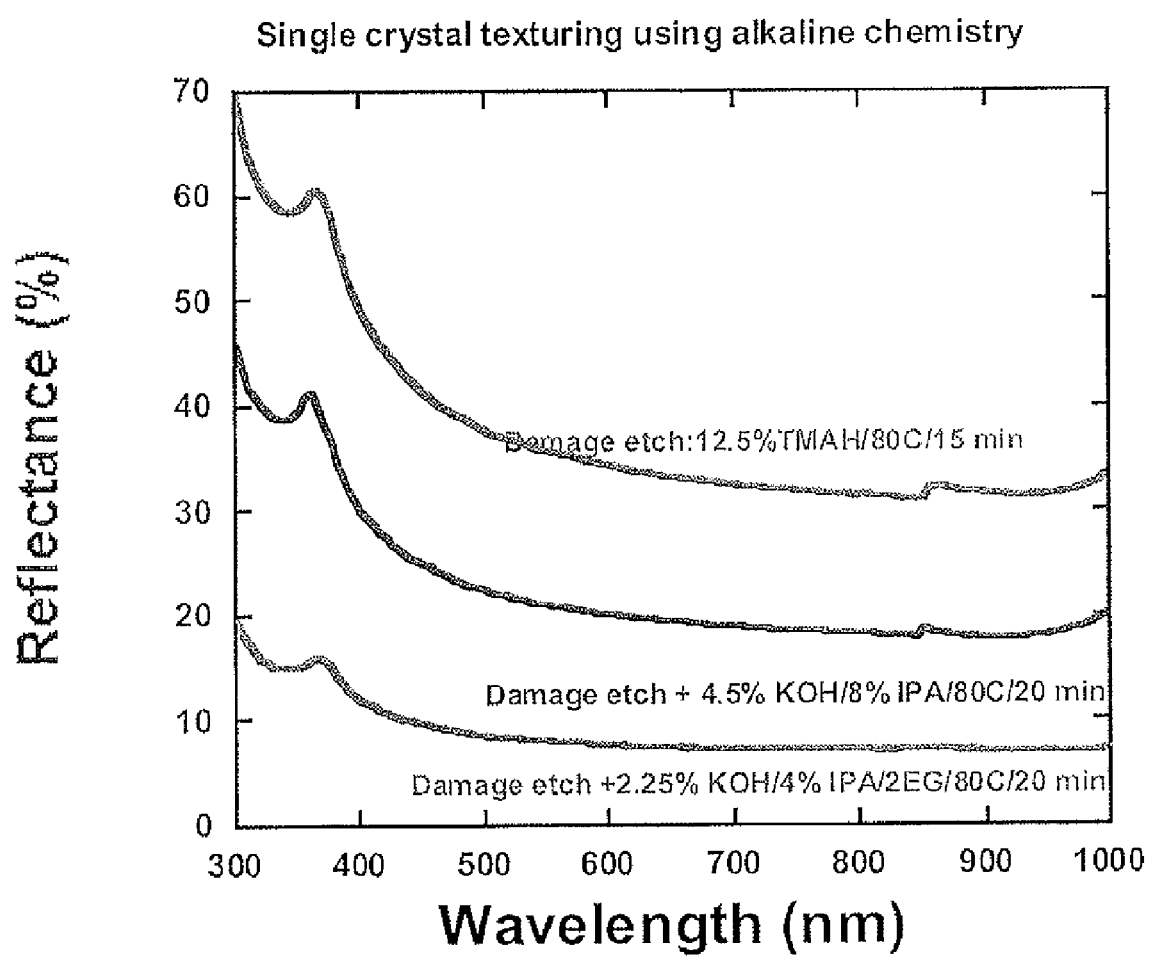
FIG. 4 is a graph showing reflectance values for the silicon wafer at different stages of the process according to the present invention.

Some results achieved by using the present invention are shown in FIGS. 1 through 4. In particular, FIG. 1 is an atomic force microscopy (AFM) view of the surface of an as-cut single crystalline silicon wafer showing macro-roughness troughs 10-20 μm in height as well as local micro-roughness of less than a micron. As noted above, this roughness as well as contaminants, e.g. abraded metal from the saw wire and grinding abrasive, must be removed for the wafer to be useful as a solar cell. According to one embodiment of the present invention, the silicon surface is smoothed and contaminants removed by using a TMAH etch solution. FIG. 2 is an AFM view of the surface of a single crystalline silicon wafer following damage etch using a TMAH etch solution according to the present invention. As can be seen in FIG. 2, the TMAH damage etch was successful in completely removing microroughness and reduced macro-roughness to less than a micron. In addition, most of the abraded contaminants were removed. The result is a very uniform and smooth surface. Texturing is then carried out using a KOH and IPA solution. FIG. 3 is an AFM view of a single crystalline silicon wafer following the texturing of the surface in accordance with the present invention and shows extremely uniform pyramidal formations across the wafer. Reflectance values for the silicon wafer at different stages of the present invention are shown in FIG. 4. In particular, a silicon wafer following damage etch with TMAH shows a relatively high degree of reflectance, 35 to 40 percent, in the visible light range. This reflectance is reduced to about 20% in the visible light range following the texturing step when using a KOH and IPA solution. Lower reflectance values, i.e. less than 8% in the visible light range, are achieved when about half of the IPA is replaced with ethylene glycol, while maintaining overall uniformity.

Figure 5:
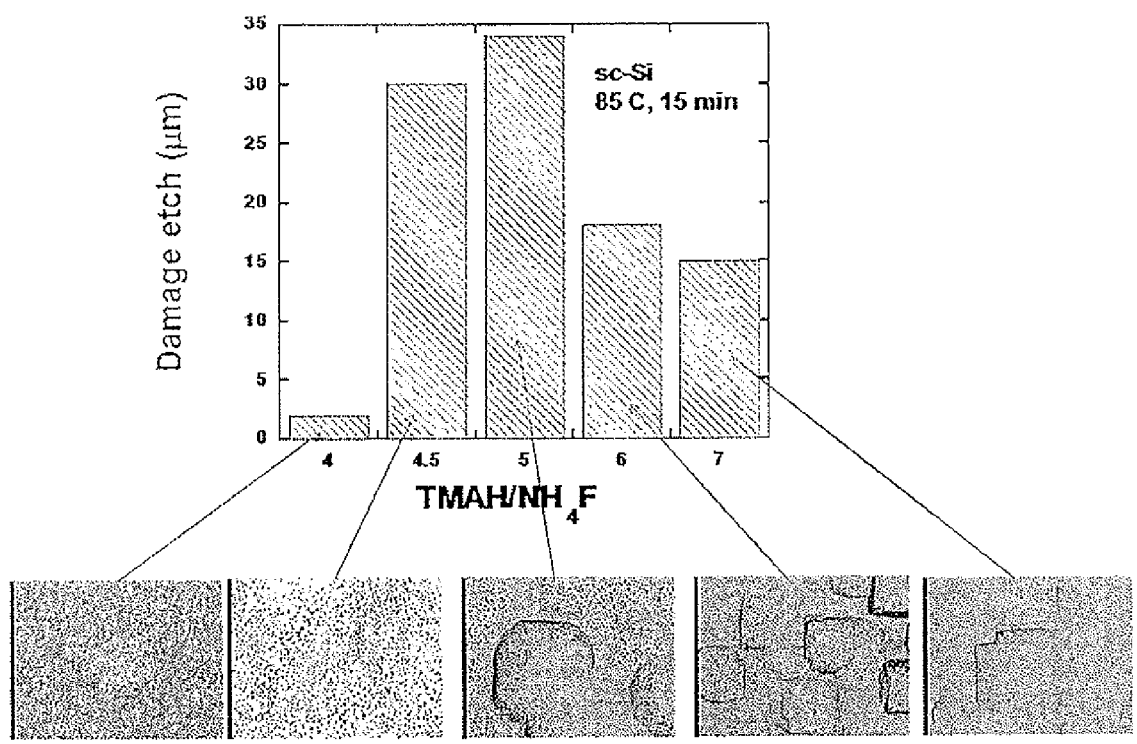
FIG. 5 shows optical images and associated etch depth graphs showing the results of a single step process using different TMAH to $NH_4F$ ratio solutions according to an embodiment of the present invention.

FIG. 5 shows optical images and associated etch depth graphs of the results of a single step process according to an embodiment of the present invention. In particular, FIG. 5 shows various results from the use of a combined mixture of TMAH and $NH_4F$ in a single step process of performing both damage etch and texturing. The graph shows the ratio of TMAH to $NH_4F$ plotted against the damage etch in μm. While high ratios of TMAH to $NH_4F$ provide high etch rates, surface roughness of the silicon wafer is reduced to the point that higher, unacceptable reflectance is exhibited. This can be seen from the optical images C, D, E. Low ratios of TMAH to $NH_4F$ leave the desired small pyramidal density and corresponding reduction of reflectance, but the etch rate for removing damage is also small, as can be seen in the optical image A and the graph. An optimum ratio of TMAH to $NH_4F$ is obtained in the range of 4:1 to 4.5:1 where the damage etch is high and a high density of pyramids is also formed (black spots) as seen in optical image B. The optimum ratio of TMAH to ammonium fluoride or ammonium di-fluoride may also depend on the amount of silicon dissolved into the solutions. Therefore, the present invention contemplates modification of the solution ratio as the process takes place. In addition, the etch rate can be further accelerated by adding KOH or NaOH to the mixture of TMAH and fluorides. The addition of KOH or NaOH is particularly favorable for industrial purposes as it may allow reductions of cost.

While the present invention has been described particularly with respect to the production of solar cells, similar methods will be useful in other device production, such as MEMS and semiconductor processing for integrated circuits. It is anticipated that other embodiments and variations of the present invention will become readily apparent to the skilled artisan in the light of the foregoing description, and it is intended that such embodiments and variations likewise be included within the scope of the invention as set out in the appended claims.

What is claimed:

1. A method in the production of a solar cell or photovoltaic device comprising:
providing a single crystal silicon wafer having damage from the manufacturing of the wafer on a surface thereof; treating the wafer with a solution comprising a fluorinated compound and an alkaline solution to simultaneously remove the damage and to texture the surface of the wafer to form pyramidal structures, wherein the fluorinated compound is ammonium fluoride, the alkaline solution is tetramethylammonium and the solution comprises a ratio of tetramethylammonium to ammonium fluoride in the range of 4:1 to 4.5:1.

2. The method of claim 1 wherein the fluorinated compound is ammonium fluoride or ammonium bifluoride.

3. The method of claim 1 wherein the alkaline solution is tetramethylammonium hydroxide.

4. The method of claim 1 wherein treating the wafer is carried out at temperatures of 100° C. or less.

5. The method of claim 1 wherein the solution further includes additives.

6. The method of claim 5 wherein the additives are isopropyl alcohol, ethylene glycol or a combination thereof.

7. The method of claim 5 wherein the additive is potassium hydroxide or sodium hydroxide.

8. A method of claim 1 wherein the damage is caused by saw cutting.

9. The method of claim 1 wherein the ratio of fluorinated compound to alkaline solution is varied during treatment of the wafer with the solution.

* * * * *